United States Patent [19]

Okura et al.

[11] Patent Number: 5,393,977
[45] Date of Patent: Feb. 28, 1995

[54] CHARGED PARTICLE BEAM APPARATUS AND IT'S OPERATING METHOD

[75] Inventors: Akimitsu Okura; Mitsugu Sato; Osamu Yamada; Yasushi Nakaizumi, all of Katsuta; Eiichi Hazaki, Tsuchiura, all of Japan

[73] Assignee: Hitachi, Ltd., Tokyo, Japan

[21] Appl. No.: 69,573

[22] Filed: Jun. 1, 1993

[30] Foreign Application Priority Data

Jun. 3, 1992 [JP] Japan .................................. 4-166720

[51] Int. Cl.6 ............................................. H01J 37/26
[52] U.S. Cl. ................... 250/306; 250/307; 250/397
[58] Field of Search ............... 250/307, 310, 311, 397, 250/306

[56] References Cited

U.S. PATENT DOCUMENTS 3,748,467  7/1973  Suganuma .......................... 250/397
3,833,811  9/1974  Koike et al. ........................ 250/311

Primary Examiner—Bruce C. Anderson
Attorney, Agent, or Firm—Antonelli, Terry, Stout & Kraus

[57] ABSTRACT

A specimen is scanned with an electron beam so as to generate a signal characteristic of the specimen to thereby produce an image thereof on the basis of the generated signal. A memory is provided for storing operating conditions of a scanning electron microscope which are associated with identification information for specifying the specimen. The identification information is designated so that thereby at least one operating condition corresponding to the designated identification information is read out from the memory, and the read out operating condition is automatically set so that the scanning electron microscope is operated under the set operating condition.

19 Claims, 7 Drawing Sheets

FIG. 4

```
1. KIND OF ─────┬─ 1.1 BIOTIC      ─┬─ 1.1.1 PLANT
   SPECIMEN    │   SUBSTANCE       ├─ 1.1.2 VIRUS·MICROBE
               │                   └─ 1.1.3 TISSUE
               │
               └─ 1.2 ABIOTIC     ─┬─ 1.2.1 MINERAL, GENERAL
                   SUBSTANCE       ├─ 1.2.2 METAL, GENERAL
                                   ├─ 1.2.3 DIELECTRIC SUBSTANCE
                                   ├─ 1.2.3 MAGNETIC SUBSTANCE
                                   ├─ 1.2.4 SEMICONDUCTOR
                                   ├─ 1.2.5 POLYMER
                                   └─ 1.2.6 FIBER

2. METHOD OF ───┬─ 2.1 WITHOUT    ─┬─ 2.1.1 CONDUCTIVE
   PREPARING   │   DEPOSIT         ├─ 2.1.2 NONCONDUCTIVE
   SPECIMEN    │                   └─ 2.1.2 SEMICONDUCTIVE
               │
               ├─ 2.2 WITH        ─┬─ 2.2.1 VACUUM DEPOSITION
               │   DEPOSIT         └─ 2.2.2 ION COATING
               │
               └─ 2.3 CONDUCTIVE STAIN·OTHERS

3. OBSERVA- ────┬─ 3.1 SURFACE OBSERVATION, GENERAL
   TION·       ├─ 3.2 ELEMENT ANALYSIS, GENERAL
   ANALYSIS    ├─ 3.3 ELEMENT ANALYSIS, FINE DEPOSIT
   MODE        ├─ 3.4 ELEMENT ANALYSIS, SURFACE
               └─ 3.5 DIFFRACTOMETRY·OTHERS

4. OPERATING ───┬─ 4.1 VACUUM
   CONDITION   ├─ 4.2 ACCELERATING VOLTAGE
               ├─ 4.3 PROBE CURRENT
               ├─ 4.4 MAGNIFICATION
               ├─ 4.5 RESOLUTION
               ├─ 4.6 TILT
               └─ 4.7 OTHERS
```

| | SAMPLE 1 | SAMPLE 2 |
|---|---|---|
| 1. NAME OF SPECIMEN | POLLEN OF CRYPTOMERIA | Si SUBSTRATE PHOTO-RESIST |
| 2. KIND OF SPECIMEN (ATTRIBUTE) | PLANT | SEMICONDUCTOR |
| 3. PREPARATION METHOD OF SPECIMEN | CRITICAL POINT DRYING Au DEPOSIT | WITHOUT DEPOSIT |
| 4. OBSERVATION MODE | SECONDARY ELECTRON IMAGE | SECONDARY ELECTRON IMAGE |
| 5. OPERATING CONDITION | | |
| (1) DEGREE OF VACUUM | $<7\times10^{-5}$ Pa | $<7\times10^{-5}$ Pa |
| (2) ACCELERATING VOLTAGE | 20KV | 1KV |
| (3) PROBE CURRENT | $1\times10^{-11}$ A | $5\times10^{-12}$ A |
| (4) MAGNIFICATION | ×50 ~ ×200K | ×100 ~ ×100K |
| (5) RESOLUTION (SPOT SIZE) | 1nm | 3.5nm |
| (6) TILT ANGLE | 0° | 30° |
| (7) BM APARTURE | NO. 1 | NO. 1 |
| (8) OBJECTIVE LENS APARTURE | NO. 4 | NO. 3 |
| (9) CONDENSER LENS KNOTCH | 5 | 5 |
| (10) IRRADIATION ANGLE | 10mrad | 10mrad |
| (11) EXPOSURE TIME | 80s | 40s |

18a1

CHARGED PARTICLE BEAM APPARATUS AND IT'S OPERATING METHOD

BACKGROUND OF THE INVENTION

The present invention relates to a charged particle beam apparatus and a method of operating the same and more particularly to a charged particle beam apparatus and a method of operating the same suitable for automatically setting an optimum operating condition of the apparatus.

For a charged particle beam apparatus, such as for example scanning electron microscope (SEM), X-ray microanalyzer (XMA or EPMA) and ion microanalyzer (IMA), which forms a scan image of a specimen in accordance with a specimen information signal derived from the specimen scanned with a spot of charged particle beam, it is very important to form the scan image of the structure and/or composition of the specimen with accuracy and clearness.

And for observation and/or analysis using the charged particle beam apparatus, the quality of the scan image is strongly affected by whether or not the conditions of various parts of the apparatus, such as, for example, conditions of accelerating voltage, probe current and lens of electron optical system, are set in optical values corresponding to the purpose.

Therefor, selecting the operation condition of the apparatus suitable for a specimen is important for observation and/or analysis using a charged particle beam apparatus.

In the past, an operator has found an optimum condition by trial and error on the basis of the operator's experience in observation and/or analysis using a charged particle apparatus.

In the past, owing to the fact, as described above, that an optimum operating condition of the apparatus for a specimen has been set, in most cases, on the basis of the operator's experience, setting optimum operating conditions of the apparatus for various kinds of specimens has been time-consuming, and moreover differences in operators' experiences have likely caused a problem of discrepancy in the results of observations of the same specimen.

SUMMARY OF THE INVENTION

It is an object of the present invention to provide a charged particle beam apparatus and a method of operating the same capable of solving the aforementioned problems caused in the conventional technology.

It is another object of the present invention to provide a charged particle beam apparatus and a method of operating the same capable of automatically setting an optimum operating condition of the apparatus.

It is still another object of the present invention to provide a charged particle of setting an optimum operating condition of the apparatus with ease and reliability and without disagreements in the observed results due to operator's experiences.

According to a charged particle beam apparatus and a method of operating the same of the present invention, stored in a memory are operating conditions of the charged particle beam apparatus which are associated with identification information for specifying a specimen, the identification information is designated whereby at least one operating condition corresponding to the designated identification information is read out from the memory, and the read out operating condition is automatically set so that the charged particle beam apparatus is operated under the set operating condition.

Other objects and features of the present invention will become apparent from the description of the preferred embodiments of the present invention in conjunction with the accompanying drawings.

BRIEF DESCRIPTION OF THE DRAWINGS

FIG. 4 is an example of menu pictures displayed on a CRT of the apparatus shown in FIG. 3, FIG. 7 is an example of operating condition pictures displayed on a CRT of the apparatus shown in FIG. 3.

DESCRIPTION OF THE PREFERRED EMBODIMENTS

Firstly, the basic concept of the present invention will be explained taking a scanning electron microscope (hereinafter referred to "SEM") as an example.

In order to perform the observations of the structures and/or compositions of various specimens with higher fidelity at the best resolution condition, it is required to select an optimum operating condition of the apparatus taking the kinds (attributes) of the specimens into consideration. The kinds (attributes) of the specimens hereupon are as follows:

(1) Biotic or Abiotic substance,
(2) Insulator or Conductor,
(3) High or Low in outgassing,
(4) Sensitive or Insensitive to charged particle beam irradiation,
(5) High or Low in moisture content,
(6) Strong or Weak in thermal resistance,
(7) Structure size to be magnified for observation, and so on.

For the apparatus, on the other hand, the following operating conditions are important factors which are required to choose appropriate values corresponding to the attributes of the specimen described above:

(1) Accelerating voltage,
(2) Beam current,
(3) Scan mode,
(4) Degree of vacuum,
(5) Detector for image forming,
(6) Optical axis alignment,
(7) Recording mode.

Then, according to the present invention, each value, described above, of the optimum operating condition of the apparatus is automatically determined corresponding to the specimen, and the observation of the specimen can always be performed under the optimum condition.

Figure 1:
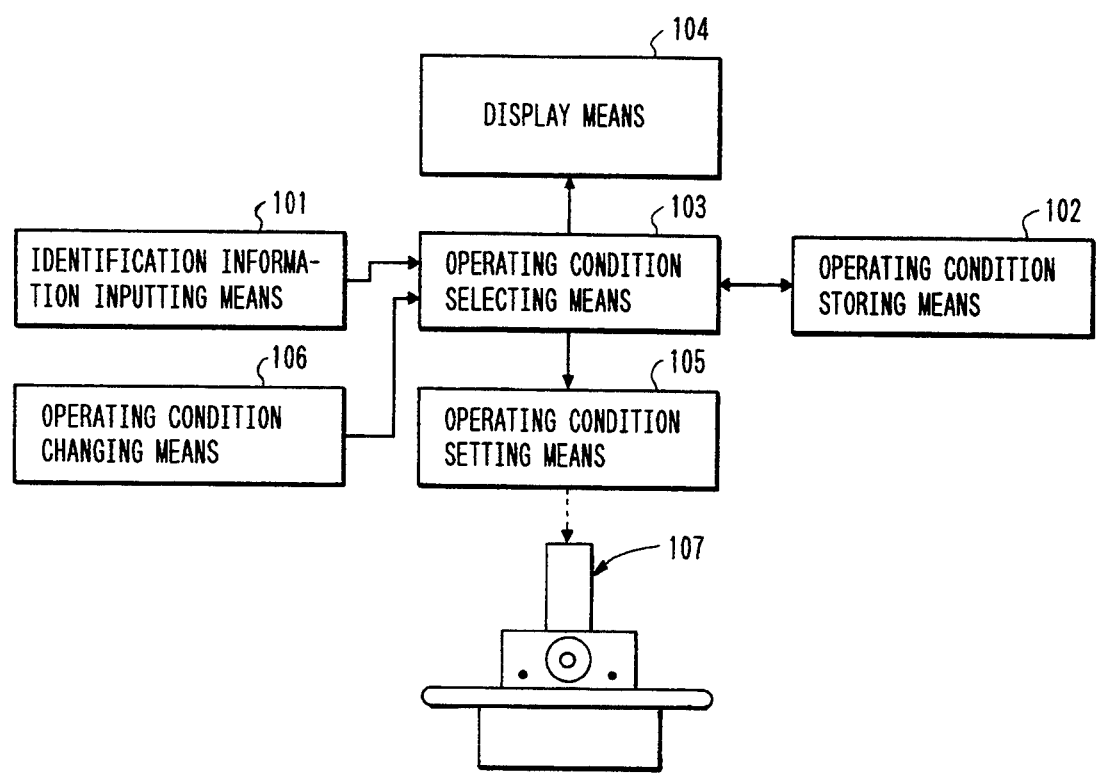
FIG. 1 is a functional block diagram of a charged particle beam apparatus showing an embodiment according to the present invention.
Figure 2:
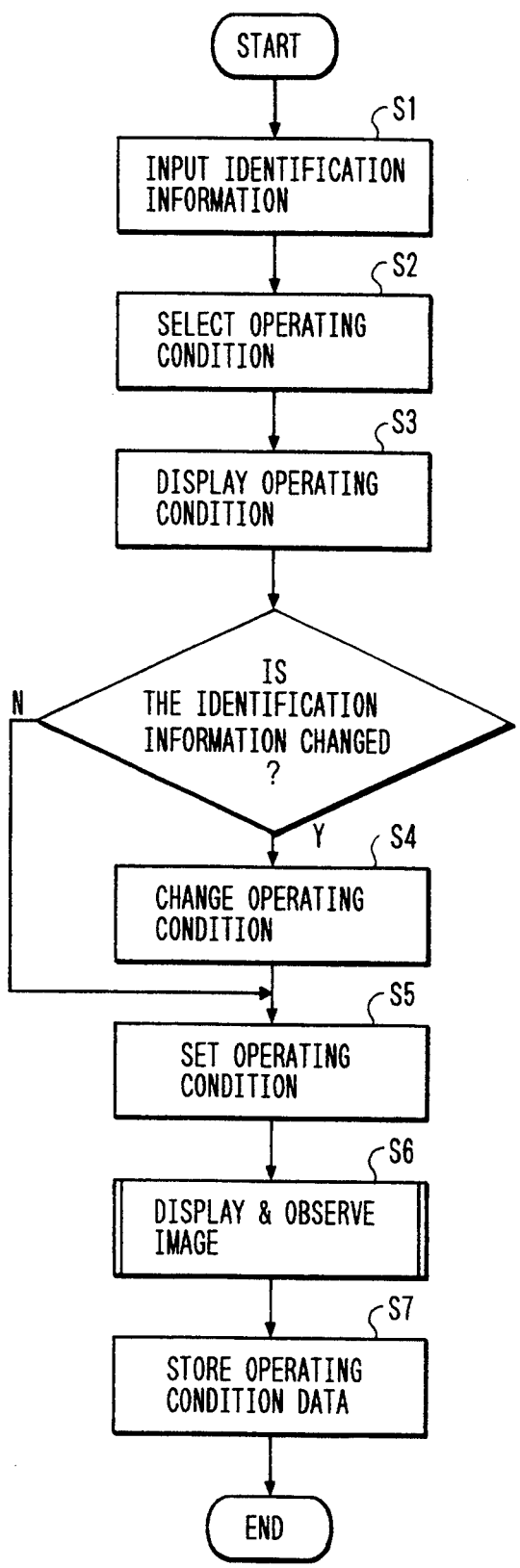
FIG. 2 is a flow chart for explaining the diagram shown in FIG. 1.

Referring to FIGS. 1 and 2, identification information to specify a specimen is inputted from a means for inputting identification information 101 by an operator's key action in a proper manner. Various kinds of operating conditions of the apparatus, such as accelerating voltage, probe current, lens condition of electron optical system, and so on, are stored in a means for storing operating condition 102, and are accessible to be selected on the bases of the identification information.

A means for selecting operating condition 103 selects an operating condition of the apparatus which responds to the identification information inputted from the means for inputting identification information 101. The content of the selected operating condition is displayed on a means for display 104. In a case where any change is required in a part of contents of the operating condition displayed on the means for display 104, the data for the change is inputted by the operator's key action from a means for changing operating condition 106. A means for setting operating conditions 105 automatically adjusts setting values of the electron beam apparatus 107 to said selected operating condition or the operating condition followed by the change.

In step S1 for such a construction, the identification information specifying the specimen to be observed is entered by the operator from the means for identification information 101. The input mode of the identification information may be any one of the following: keyword input mode where the name of the specimen is directly inputted; free keyword mode where the attribute of the specimen is inputted; menu selection mode where items corresponding to the specimen are selected from a table of the attribute information according to a menu programmed in advance; or modes properly combined the above modes.

In step 2, after the completion of inputting identification information on the specimen, the means for selecting operating conditions 103 carries out retrieval in the means for storing operating conditions 102 according to said identification information and selects the operating condition corresponded to said identification information.

In step S3, the table of the content of the operating condition selected by the means for selecting operating condition 103 is displayed on the means for display 104.

Incidentally, although the operating condition selected by the means for selecting operating conditions 103 is an optimum operating condition of the apparatus for observing the specimen which is determined by the identification information, the condition is not always determined unequivocally, and there possibly need be choices to a certain extent. Therefore, in a case of making changes in a part of the displayed operating condition, in step S4 the data related to the items to be changed are inputted through the means for changing operating condition 106.

Thus, in step S5, after the operating condition is determined, each part of the electron beam fixed apparatus 107 is set in said operating condition of the apparatus by the means for setting operation conditions 105. In step S6, the scan image is displayed, observed, taken photograph and so on.

In step S7, the operating condition of the apparatus is obtain as an output on a printer, and at the same time transferred to the means for storing operating condition 102. Said operating condition of the apparatus is stored in the memory 102 as the operating condition corresponding to the identification information above.

Next, referring to figures, detailed explanation will be made of an embodiment of the present invention.

Figure 3:
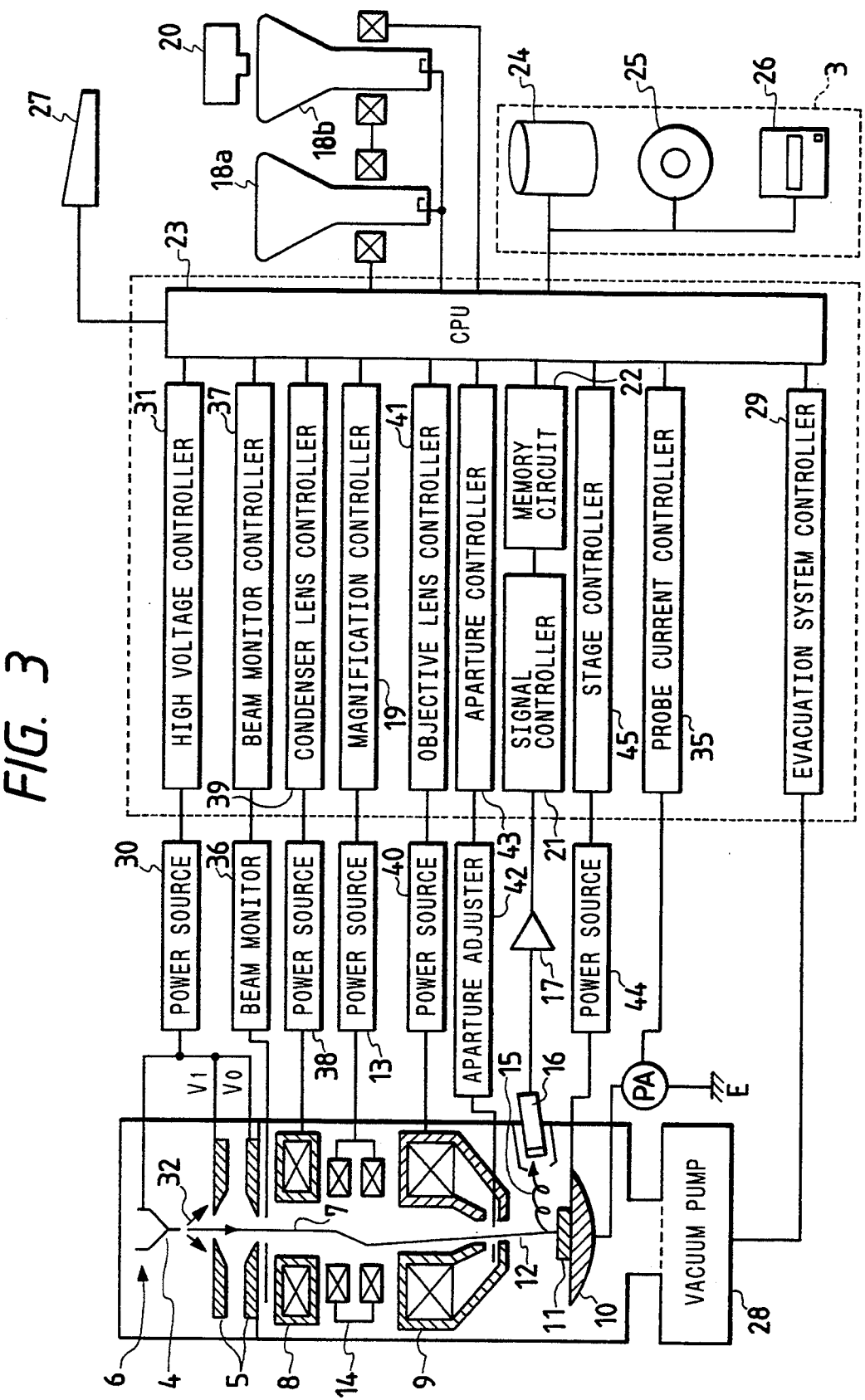
FIG. 3 is a schematic block diagram, partly in section, of an embodiment of an charged particle beam apparatus according to the present invention.

FIG. 3 shows the construction of an embodiment of an SEM according to the present invention, and particularly here, a field emission type SEM having a 2-stage electro-magnetic condenser lens system.

In the figure, an electron beam 7 emitted from a field emission type electron gun 6, composed of a field emission cathode 4, electron lenses 5, and so on, is focused onto the surface of a specimen 11 mounted on a specimen stage 10 into a very sharp electron beam probe 12 with a condenser lens 8 and an objective lens 9.

The electron beam probe 12 is deflected and scans on the surface of the specimen by a deflection coil 14 actuated with a deflection coil power supply 13. Secondary electrons 15 generated on the surface of the specimen by the scanning of the electron beam probe 12 are directed to a secondary-electron detector 16. Furthermore, in a case where reflected electrons or transmitted electrons are detected as a signal derived from the specimen 11, a reflected electron detector(not shown) or a transmitted electron detector(not shown) is arranged above or below the specimen respectively.

The signal detected by the secondary-electron detector cathode ray tubes(hereinafter, referred to as "CRT") 18a, 18b as an image signal.

Adjustment of a magnification factor of a scan image is performed by varying the scanning width of the electron beam probe 12 on the surface of the specimen with a magnification controller 19 and by adjusting the ratio of the scanning width to the screen width of the CRT 18a, 18b.

Further, in a case where recording of the scan image is required, the photograph of the image displayed on the CRT 18b is taken with a camera system 20, or the picture image is stored in a memory 22 through a signal controller 21, and moreover stored in an external memory 3, such as a hard disk 24, an optical disk 25, a magnet-optical disk 26 or the like, through a central processing unit (CPU) 23.

Figure 6:
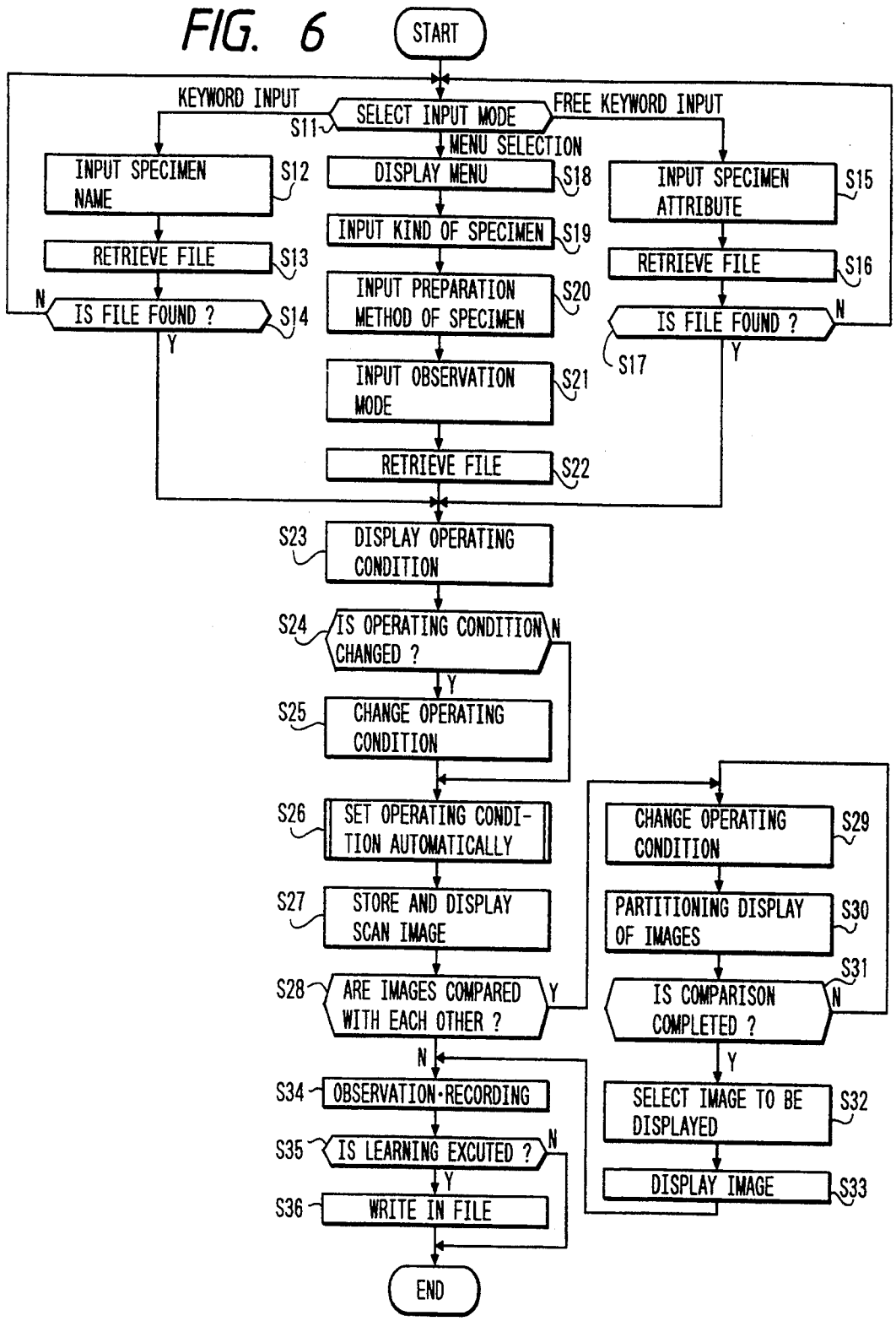
FIG. 6 is a flow chart for explaining the operation of the system of FIG. 3.

Next, referring to the flow chart of FIG. 6, explanation will be made of the method of setting an operating condition for an electron microscope having the aforementioned construction.

In step S11, a picture for processing of inputting identification information to specify a specimen is displayed on the CRT 18a to select any one among keyword, free keyword and menu selection input modes.

Here, in a case where an operator selects the keyword input mode through the operation board 27, then in step S12, the operator inputs from the operation board 27 the name of the specimen to be observed, for example "pollen of cryptomeria" or "silicon substrate photoresist". Further, in a where a specified code number is assigned to each specimen name, the code number may be inputted instead of the name of the specimen.

In step S13, retrieval of the data files stored in the memory in the central processing unit 23 or in the external memory 3 is performed on the bases of the name of the specimen imputed. When a data file corresponding to the name of the specimen inputted is found, then the processing goes from step S14 to step S23. If not found, the processing returns to step S11.

On the other hand, in a case where the free keyword input mode is selected, in step S15 the operator inputs from the operation board 27 the attribute of the specimen, such as "plant" when the specimen is "pollen of cryptomeria" or "semiconductor" when the specimen is "silicon substrate photoresist". Moreover, the number of inputting items on the attribute is not limited to one, and inputting a plurality of items on the attribute of the specimen makes the selection of the optimum operating condition more reliable.

In step S16, retrieval of the data files in the internal memory of the central processing unit 23 or in the external memory 3 is performed. When a data file corresponding to the attribute inputted is found, the processing goes from step S17 to step S23. If not found, the processing returns to step S11.

In step S11, in a case where the menu selection mode is selected, then in step S18 a menu with hierarchical structures, illustrated in FIG. 4 as an example, is displayed on a display surface 18a1 of the CRT 18a. In step S19 to step S21, the operator inputs the data corresponding to the specimen as to (1.kind of specimen), (2.method of preparing specimen) and (3.observation analysis mode of specimen) referring to the displayed menu in a form of numerals and/or letters with a proper means such as keyboard entry on speech entry. In the embodiment here, (1. kind of specimen) and (2. method of preparing specimen) are of hierarchical structures.

Incidentally, the item (4. operating condition) in FIG. 4 is, as explained later, selected when any changes in the automatically settled operating condition is required, and is not a peculiar item for the menu selection mode. Further, the degree of vacuum of the apparatus means a required ultimate vacuum in the specimen chamber of a body tube, and does not mean a controlling value of value of vacuum. Even further, the magnification is a range of magnification suitable for observation which the operator may change. Furthermore, the resolution is a calculated spot size. Although the probe current and the irradiating tilt vary depending on the accelerating voltage, the beam monitor aperture, the objective lens aperture, the condenser lens condition and so on, the probe current and the irradiating tilt are calculable on the electro-optical basis, and are instantaneously computed with the central processing unit 23 and are displayed.

In step S22, retrieval of data files in the interval memory in the central processing unit 23 or the external memory 3 is performed on the basis of the content selected in each item. In step S23, a retrieved data file or an optimum operating condition for said specimen is displayed on the CRT 18a.

FIG. 7 shows contents of the above-set operating conditions displayed on a display surface 18a1 of the CRT 18a, wherein the operating conditions selected for the specimens of "pollen of cryptomeria" and "silicon substrate photoresist" are juxtaposed for the purpose of comparison of how the selected operating conditions may differ depending on the specimens.

Comparing the accelerating voltages, the voltage for "silicon substrate photoresist" is suppressed lower (1/20) than that for "pollen of cryptomeria", which certifies the prevention against the destruction of the specimen being considered.

After being displayed the operating condition as described above, the operator checks the operating condition referring to the picture of the CRT 18a. When any changes in the items are required, the processing goes from step S24 to step S25. In step S25, the operator makes changes in part of the operating condition by inputting data corresponding to the items to be changed through the operating board 27.

After settling the optimum operation condition of the apparatus according to the processing described above, in step S26 the operating condition of the apparatus is set, for example, in the following sequence:

(1) A vacuum pump system controller 29, which regulates a vacuum system such as a vacuum pump 28 and so on, is activated and controls the degree of vacuum.

(2) A high voltage controller 31 which controls a high voltage supply 30 for the electron gun is activated and controls an emission current 32 from the field emission cathode 4, an emission extracting voltage(V1) and an acceleration voltage(V0) added to the electrostatic lenses 5.

(3) A probe current detector pA disposed between the specimen 11 and earth E measures a probe current during the specimen 11 being irradiate with the electron bream7 emitted from the electron gun 6. A probe current controller 35 mechanically adjusts the optical axis of the electron gun in such a way to minimize the probe current cooperating with the probe current detector (there mounted an electron gun axis drive, not shown in the figure, which regulates the knob for adjusting the axis of the electron gun without manipulation). In another case, the probe current controller performs the electrical alignment of the electron gun axis so as to coincide with the electron optical axis of the body tube of the apparatus using a reflecting means (not shown) such as electrostatic reflecting plates arranged in the vicinity of the optical axis of the electron gun 6.

Further, the alignment of the electron gun axis may be performed with a beam monitor controller 37 and a beam monitor unit 36 arranged below the electron gun 6 so as to maximize the current of the electron beam 7 instead of the probe current.

(4) After excitation of the condenser lens 8, the alignment of the condenser lens axis is performed with a condenser lens axis drive(not shown) so as to maximize the probe current of the electron beam probe 12. In another case, the alignment of the lens axis is performed with the condenser lens axis drive so that the image picture of the specimen 11 becomes concentrically dim near the center of the CRT 18a when the lens current is slightly increased or decreased through a condenser lens power supply 38 and a condenser lens controller 39.

On this occasion, the judgement whether or not the image is concentrically dim may be left to the operator. Otherwise, the lens axis may be automatically aligned in such manner that the image near the center of the CRT 18a approaches to the sharpest among images which are obtained by N-times of trials of increasing and decreasing the condenser lens current and stored in the memory 22 through the signal 21.

(5) After exciting the objective lens, alignment of the objective lens, alignment of the objective lens axis is performed in the same manner as item (4) above with maximizing the current of the electron beam probe 12, or else with making the image near the center of the CRT 18a concentrically dim using an objective lens power supply 40 and an objective lens controller 41 cooperating with the signal controller 21 and the memory 22.

There are some cases where at least one of the axes for electron gun, for objective lens and for condenser lens, is mechanically fixed as a result of design of the apparatus. In such cases, alignment of fixed axes may be omitted, axis alignment sequence of items (3), (4), (5)

above does not need to be taken into consideration, and it is sufficient that the movable axes are adjustable to the central axis of the electron optical system without moving of the lens axes mechanically fixed.

(6) Alignment os optical axes for an objective lens aperture 42 and for a beam monitor unit 36 is performed in the same manner as items (4), (5) above using an objective lens apature controller 43 and a beam monitor controller 37 respectively.

(7) After completion of electron optical axis alignment, a specimen tilt angle is set up suitable for observing the specimen 11. This setting is performed using a specimen stage drive power supply 44 and a stage controller 45. It is desirable that processing of final setting of tilt angle is so programmed that the operator takes part in judgement because of limitation in range of tilt angle variation caused from apparatus design and, moreover, because of requirement to vary tilt angle during observation.

After setting operating condition as described above, in step S27 the scan image obtained under said operating condition is stored in the memory 22 and simultaneously displayed on the CRT 18a.

While, in the above example, a magnification factor is adjusted by the operator, instead of automated setting, within the optimum range of operating condition indicated in the screen displayed (Refer to FIG. 4), it is to be understood that the present invention is not limited to the example and the an automated setting for magnification factor may be introduced.

In step S28, selection is made on whether or not comparison is made on images obtained from different operating condition and identical specimen. In a case where the comparison is carried out, the processing goes to step S29.

In step S29, the operator changes the operating condition by inputting items and data to be changed through the operating board. In step S30, the scan image before changing the operating condition, being read out from the memory 22, is displayed on the right hand side half, for example, of the screen of the CRT 18a or 18b, and the scan image after changing on the left hand side half.

In this situation, the operator is able to confirm clearly how the scan image varies with changing operating condition with easiness and reliability.

After completing image comparison and setting optimum operating condition in step S31, in step S32 selection is made on the images before and after changing operating condition, and then the selected image is displayed on the whole screen of the CRT 18a or 18b.

In step S34, observation and recording are performed based on the scan image displayed. In step S35, the operator judges whether or not learning is executed, wherein said learning is writing newly in the memory the operating condition changed in step S29 as an optimum operating condition for the specimen or is updating the operating condition which has been stored hitherto in step S36.

According to the embodiment described above, an optimum operating condition for each specimen is automatically set based on stored identification information data specifying specimens such as names, attributes and so on. The observation of specimen under an optimum condition, therefore, is achieved with easiness and reliability.

Further, in the above embodiment, the easiness in changing the operating condition, which is automatically selected based on an identification information, allows fine adjustment of operating condition depending on the state of each specimen.

Furthermore, in the above embodiment, simultaneous display of two scan images under different operating conditions allows simplicity in finding an optimum operating condition. Moreover, in the above embodiment, improving learning effect with newly storing operating conditions obtained in such manner as optimum operating conditions enhances easiness in operation.

While the menu illustrated in FIG. 4 has a two-stage hierarchy structure, more stages may be adopted. Moreover, in observing image after setting an optimum operating condition for the specimen 11, automatic controls for focusing, stigmator, fine alignment and bright/contrast, which most modern SEMS are usually equiped with, may be realized through the central processing unit 23 operable with a simple key pushing action.

Figure 5:
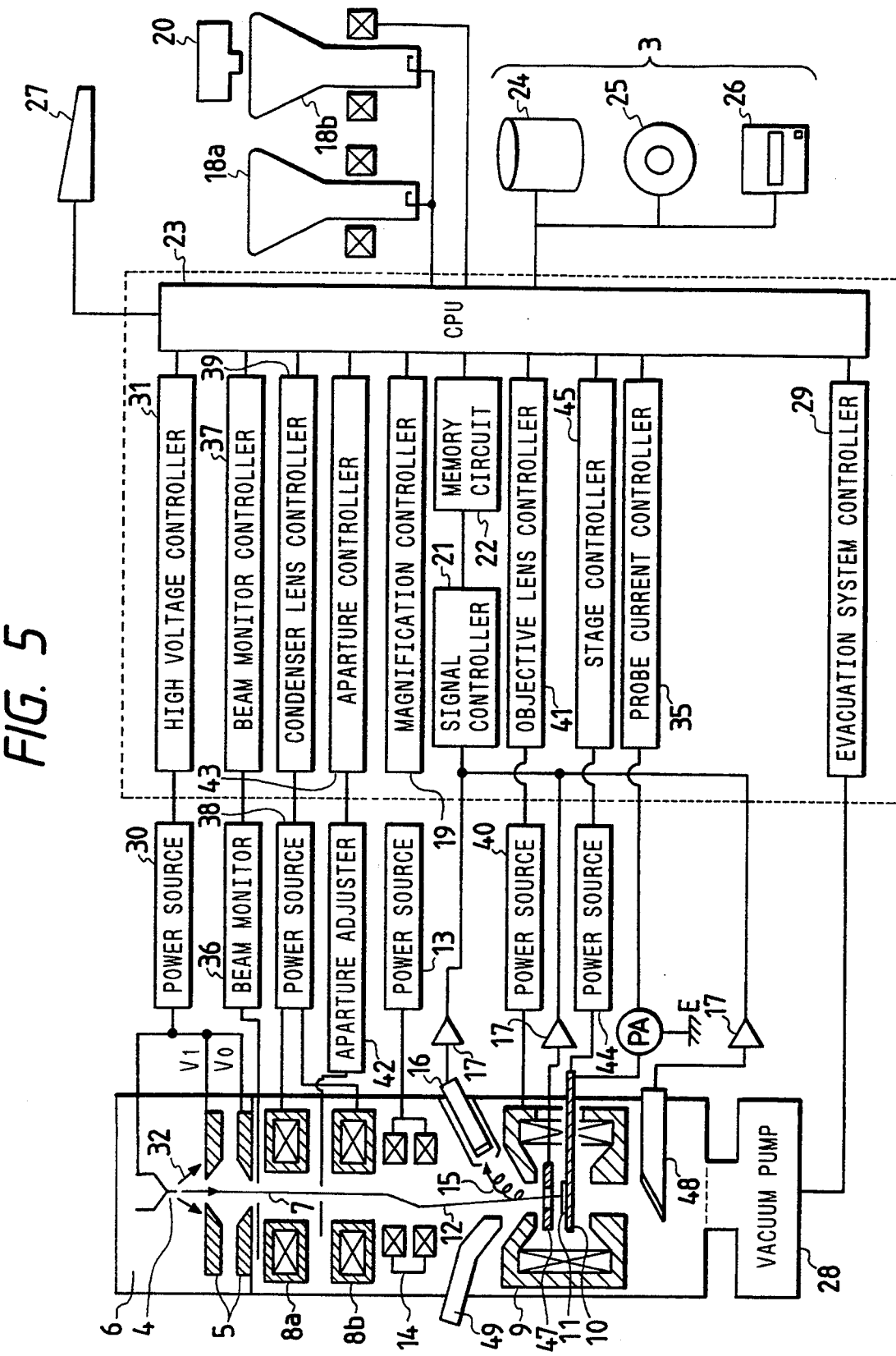
FIG. 5 is a schematic block diagram, partly in section, of another embodiment of a charged particle beam apparatus according to the present invention.

FIG. 5 shows the schematic structure of another embodiment of an in-lens type SEM according to the present invention, in which the same numbers in the foregoing refer to the same or like parts.

Referring to FIG. 5 the apparatus comprises a three-stage electro-magnetic lens system formed of a first condenser lens 8a, a second condenser lens 8b and an objective lens 9 in order to accurately control irradiation tilt angle and probe current of an electron beam probe 12 onto a specimen 11. Further, a backscattered electron detector 47 is installed in an objective lens gap and is supported in such manner as to easily inserted to and withdraw from the optical axis position.

Still further, a transmitted electron detector 48 is arranged below the objective lens 9 in order to observe scanning transmitted electron images. Furthermore, an energy dispersive X-ray detector 49 is installed above the objective lens 9.

The above construction permits observation and analysis by secondary, backscattered and transmitted electron images, and X-ray microanalysis, and makes, therefore, more suitable method of observation and analysis for specimens widely applicable.

It is to be understood that the present invention is not limited to the foregoing embodiments, since the invention is capable of providing the same effects when applied to various charged perticle beam apparatus and the like, such as transmission electron microscopes, X-ray microanalyzers, scanning tunneling microscopes combined with scanning electron microscopes, electron beam testers, ion microprobe analyzers.

While, in the foregoing embodiments, the means for storing such as memory has been described to store operating conditions in advance and the operating condition responded to name or attribute is read out therefrom, the present invention is not limited thereto and the operator may produce operating condition and store thereof in the memory.

As has been explained in the foregoing, according to the embodiments of the present invention, the following effects will be achieved:

(1) The optimum operating condition with regard to the specimen can be automatically set by means of simply inputting the identification information to specify the specimen such as name or attribute. That is, observation under the optimum condition for the specimen can be achieved with easiness and reliability.

(2) The operating condition selected automatically on the bases of the identification information can be easily changed, which can provide fine adjustment of the operating condition depending on a situation of the specimen.

(3) The scan images of identical specimen obtained under different operating conditions can be displayed at the same time, which can provide the easiness of finding a more optimized operating condition. Further, the operating condition found therefrom can be newly stored as an optimum operating condition for the specimen, and the learning effect is increased thereby. That is, the easiness of operating the apparatus is improved.

Since it is obvious that many changes and modifications can be made in the above described details without departing from the nature and spirit of the invention, it is to be understood that the invention is not to be limited to the details described herein.

We claim:

1. A charged particle beam apparatus, comprising:
   (1) means for generating a charged particle beam and irradiating a specimen with the same;
   (2) means for storing operating conditions of the charged particle beam apparatus which are associated with identification information for specifying the specimen;
   (3) means for designating the identification information to thereby read out at least one operating condition corresponding to the designated identification information from the storing means; and
   (4) means for automatically setting the read out operating condition so as to operate the charged particle beam apparatus under the set operating condition.

2. A charged particle beam apparatus according to claim 1, wherein the identification information is a name of the specimen.

3. A charged particle beam apparatus according to claim 1, wherein the identification information is attribute information of the specimen.

4. A charged particle beam apparatus according to claim 1, further comprising means for displaying a list of attribute information, the designating of the identification being performed by designating at least one item in the list of attribute information.

5. A charged particle beam apparatus according to claim 1, further comprising means for displaying the read out operating condition.

6. A charged particle beam apparatus wherein a specimen is irradiated with a charged particle beam so as to generate an information signal characteristic of the specimen to thereby produce an image thereof, the charged particle beam apparatus comprising:
   (1) means for storing operating conditions of the charged particle beam apparatus which are associated with identification information for specifying the specimen;
   (2) means for designating the identification information to thereby read out operating conditions corresponding to the designated identification information from the storing means; and
   (3) means for automatically setting the read out operating conditions so as to operate the charged particle beam apparatus under the set operating conditions.

7. A charged particle beam apparatus according to claim 6, wherein the identification information is a name of the specimen.

8. A charged particle beam apparatus according to claim 6, wherein the identification information is attribute information of the specimen.

9. A charged particle beam apparatus according to claim 6, further comprising means for displaying a list of attribute information, the designating of the identification information being performed by designating at least one item in the list of attribute information.

10. A charged particle beam apparatus according to claim 6, further comprising means for displaying the read out operating conditions.

11. A charged particle beam apparatus according to claim 10, further comprising means for changing at least one of the displayed operating conditions so as to store the changed operating condition.

12. A charged particle beam apparatus according to claim 10 or 11, wherein the displaying means comprises means for simultaneously displaying a first image of the specimen under one of the operating conditions and a second image of the specimen under another of the operating conditions independently of each other.

13. A method of operating a charged particle beam apparatus wherein a specimen is irradiated with a charged particle beam and a memory is provided for storing operating conditions of the charged particle beam apparatus which are associated with identification information for specifying the specimen, comprising the steps of:
   (1) designating the identification information to thereby read out at least one operating condition corresponding to the designated identification information from the memory; and
   (2) automatically setting the read out operating condition so as to operate the charged particle beam apparatus under the set operating condition.

14. A method of operating a charged particle beam apparatus wherein a specimen is scanned with a charged particle beam so as to generate an information signal characteristic of the specimen to thereby produce an image thereof on the basis of the generated information signal and a memory is provided for storing operating conditions of the charged particle beam apparatus which are associated with identification information for specifying the specimen, comprising the step of:
   (1) designating the identification information to thereby read out operating conditions corresponding to the designated identification information from the memory; and
   (2) automatically setting the read out operating conditions so as to operate the charged particle beam apparatus under the set operating conditions.

15. A method of operating charged particle beam apparatus according to claim 13 or 14, wherein the identification information is a name of the specimen.

16. A method of operating a charged particle beam apparatus according to claim 13 or 14, wherein the identification information is attribute information of the specimen.

17. A method of operating a charged particle beam apparatus according to claim 13 or 14, further comprising the step of displaying a list of attribute information, the step of designating the identification information being performed by designating at least one item in the list of attribute information.

18. A method of operating a charged particle beam apparatus according to claim 13, further comprising the step of displaying the read out operating condition.

19. A method of operating a charged particle beam apparatus according to claim 14, further comprising the steps of displaying the read out operating conditions and changing at least one of the displayed operating conditions so as to store the changed operating condition in the memory.

* * * * *